(12) United States Patent
Cananzi

(10) Patent No.: US 10,921,365 B2
(45) Date of Patent: Feb. 16, 2021

(54) HIGH-POTENTIAL TESTING OF CONDUCTIVE LANDS OF A PRINTED CIRCUIT BOARD

(71) Applicant: Arista Networks, Inc., Santa Clara, CA (US)

(72) Inventor: David A. Cananzi, Santa Clara, CA (US)

(73) Assignee: Arista Networks, Inc., Santa Clara, CA (US)

(*) Notice: Subject to any disclaimer, the term of this patent is extended or adjusted under 35 U.S.C. 154(b) by 115 days.

(21) Appl. No.: 16/381,611

(22) Filed: Apr. 11, 2019

(65) Prior Publication Data
US 2020/0326367 A1 Oct. 15, 2020

(51) Int. Cl.
*G01R 31/28* (2006.01)
*H05K 1/02* (2006.01)

(52) U.S. Cl.
CPC ....... *G01R 31/2812* (2013.01); *H05K 1/0268* (2013.01)

(58) Field of Classification Search
CPC .... G01R 31/2812; G01R 31/18; G01R 31/20; H05K 1/0268
USPC ..................................... 324/763.01
See application file for complete search history.

(56) References Cited

U.S. PATENT DOCUMENTS

2004/0254749 A1* 12/2004 Kageura ................ G01R 15/00
702/59

FOREIGN PATENT DOCUMENTS

| JP | 59088839 A | * | 5/1984 | ............. H01L 24/80 |
| JP | 2008058254 A | * | 3/2008 | |
| KR | 10-2016-0085290 | * | 1/2018 | ......... G01R 29/0807 |

OTHER PUBLICATIONS

Anonymous, Test for Effect of Ionic Residue on Circuit Boards, Jun. 1989, Research Disclosure, RD302019 (Year: 1989).*

* cited by examiner

*Primary Examiner* — Christopher E Mahoney
(74) *Attorney, Agent, or Firm* — Fountainhead Law Group P.C.

(57) ABSTRACT

A method for testing a printed circuit board is provided. The method includes accessing a list of conductive lands of a printed circuit board to be tested and forming a list of pairs of adjacent conductive lands, based on adjacency assessment in the list of conductive lands. The method includes performing high-potential testing on the printed circuit board, on each of the pairs of adjacent conductive lands.

20 Claims, 5 Drawing Sheets

Conductive Lands in Printed Circuit Board

| High-Potential Test Pairs of Adjacent Lands | Do Not High-Pontential Test Pairs of Lands |
|---|---|
| AB  AE | AC  AD  AF  AG  AH |
| BF  BC | AI  AJ  AK  AL |
| CD  CG | BD  BE  BG  BH |
| DH | BI  BJ  BK  BL |
| EF  EI | CE  CF  CH  CI |
| FG  FJ | CJ  CK  CL |
| GH  GK | DE  DF  DG |
| HL | DF  DJ  DK  DL |
| IJ | EG  EH  EJ  EK |
| JK | EL |
| KL | FH  FI  FK  FL |
|  | GI  GJ  GL |
|  | HI  HJ  HK |
|  | IK  IL  JL |

HIGH-POTENTIAL TESTING OF CONDUCTIVE LANDS OF A PRINTED CIRCUIT BOARD

BACKGROUND

Printed Circuit Boards (PCB) are typically comprised of laminated layers of fiberglass clad in annealed copper. This creates alternating conductor and dielectric layers. Lands defined in the conductive copper layers transfer electric power and signals (i.e., for the circuit made of circuit traces on the PCB and components mounted to the PCB), and the fiberglass dielectric contains the energy and electrically insulates various conductors on the board. An electric field is related to voltage through the following equation.

$$\vec{E} = -\vec{\nabla} V$$

If the intensity of the electric field is too strong, the dielectric will breakdown and no longer insulate conductors. For a high-energy system, this is catastrophic and can result in short circuits on the PCB, failed components and system failure. Engineering design can account for dielectric strength and ensure enough separation. However, during the printed circuit board fabrication process, impurities can be introduced and degrade the dielectric material. It is necessary to test the dielectric integrity of the PCB during the fabrication stage. This is a time-consuming process whereby electrodes connect to each copper shape or land and excite a potential between lands. A design may have thousands of such shapes and many combinations, and for each combination the high-potential stimulus must be exerted typically for enough time to approximate the electrical stress the PCB encounters over its lifetime. Designs with large numbers of conductive lands may have a large amount of test time for high-potential testing, or be inadequately tested. There is a need in the art for a solution which overcomes the drawbacks described above.

SUMMARY

In some embodiments, a method for testing a printed circuit board is provided. The method includes accessing a list of conductive lands of a printed circuit board to be tested and forming a list of pairs of adjacent conductive lands, based on adjacency assessment in the list of conductive lands. The method includes performing high-potential testing on the printed circuit board, on each of the pairs of adjacent conductive lands.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A system and method described herein perform high-potential testing of pairs of adjacent conductive lands of a printed circuit board, and greatly reduce the number of pairs of conductive lands subjected to high-potential testing, along with attendant high-potential test time, in comparison to testing all possible pairs of conductive lands of a printed circuit board. A test pattern generator, with adjacency assessment, assesses each conductive land, finds conductive land (s) that are adjacent, and forms a list of adjacent conductive lands with instructions for testing. A high-potential tester then probes the printed circuit board, testing only the pairs of adjacent conductive lands. By eliminating the need for high-potential testing pairs of conductive lands that are not adjacent, the system and method improve efficiency and reduce test time, thereby making a practical application of high-potential testing printed circuit boards, with an improvement in the technology of high-potential testing.

Existing high-potential testing systems test all possible combinations of conductive lands in pairs, or for some complex designs simply do not test at all. In one experimental example, a system with 200 pairs of conductive lands (i.e., nets or shapes), tested at 30 seconds for each pair of conductive lands for a total of 6000 seconds or 100 minutes, was successfully tested utilizing approximately 24 tests in 12 minutes using an embodiment of the system and method described herein.

Figure 1:
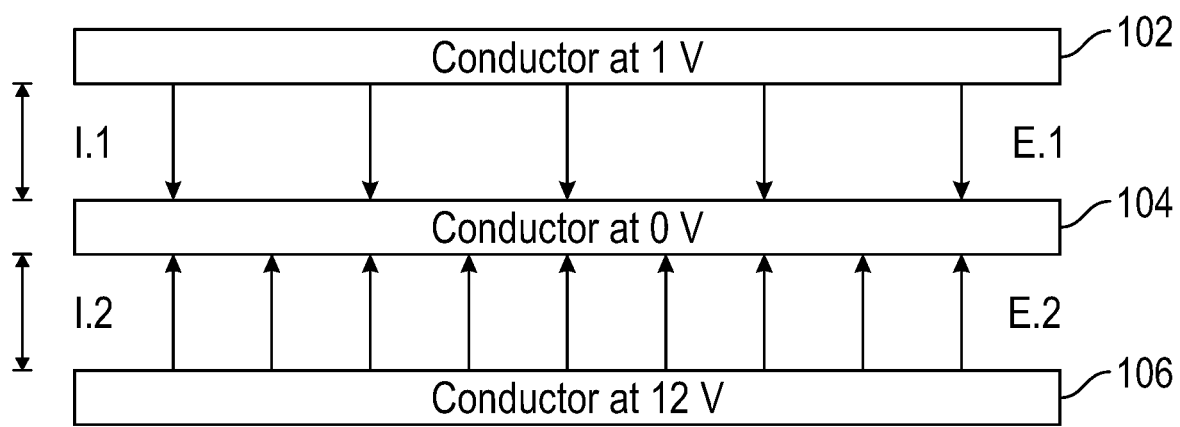
FIG. 1 depicts electric field between different conductors, in a cross-section view of a printed circuit board (PCB) in accordance with some embodiments.

FIG. 1 depicts electric field between different conductors, in a cross-section view of a printed circuit board (PCB). Insulating layers, also called dielectric layers and typically implemented with fiberglass layers, are removed for clarity of the drawing and emphasis on the conductors, which are also called conductive lands of the printed circuit board. Also not shown are commonly used vias for connecting lands between layers (but see FIG. 2).

At the top of the drawing, the first conductor 102 is at 1 V. In the middle, the second conductor 104 is at 0 V, and could be for example a ground plane or a land at ground potential. At the bottom, the third conductor 106 is at 12 V, in this example. Each charged conductor at a specific potential creates a barrier for other conductors. So, for example in FIG. 1, the conductor 104 at 0 V forms a barrier between the conductor 102 at 1 V and the conductor 106 at 12 V. By Gauss Law, if the separation between the first conductor 102 and the second conductor 104, called length 1 and labeled "1.1" is equal to the separation between the second conductor 104 and the third conductor 106, called length 2 and labeled "1.2", the electric field intensity between the 12 V to 0 V conductor pair (i.e., conductors 106, 104), labeled "E.2", is greater than the electric field intensity between the 1 V to 0 V conductor pair (i.e. conductors 102, 104), labeled "E.1". Accordingly, the concern for dielectric breakdown in practical printed circuit boards should be directed to electrically adjacent conductors, and non-adjacent conductors are of much less or no concern. Since a PCB structure is planar by nature, the definition for electrically adjacent conductors can be simplified to conductors above, below and beside a conductor under consideration (see FIG. 2). For high-potential testing, the system and method described herein ensure sufficient test coverage by selectively testing adjacent conductors. The selective approach reduces the number of test combinations to save test time, thereby increasing fabrication throughput.

The system (or software program implementing the method, and executing on one or more processors) follows an algorithm of spatial recognition, for example:

1. Identify conductors (i.e. nets) at fixed potential
2. Identify nets above for test
3. Identify nets beside for test
4. Identify nets below for test
5. Test selected nets In the example in FIG. 1, this means the conductor 102 at 1V is high-potential tested against the 0 V conductor 104, and the 12 V conductor 106 is high-potential tested to the 0 V conductor 104. It is not necessary to high-potential test the 1 V conductor 102 to the 12 V conductor 106.

Figure 2:
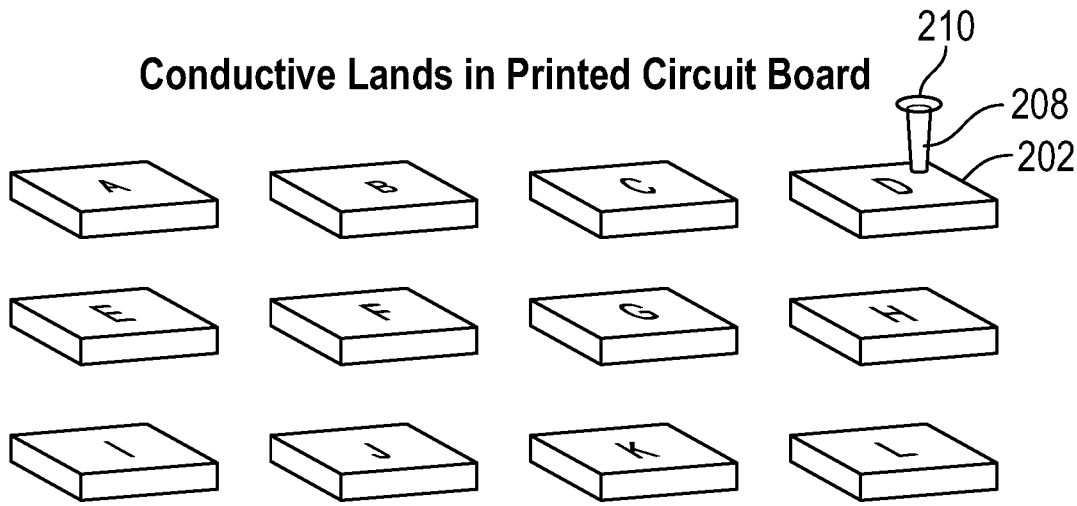
FIG. 2 depicts conductive lands in a perspective cross-section view of a printed circuit board, with a list of pairs of adjacent conductive lands for high-potential test in accordance with some embodiments.

FIG. 2 depicts conductive lands in a perspective cross-section view of a printed circuit board, with a list of pairs of adjacent conductive lands for high-potential test. Similar to FIG. 1, the insulating or dielectric layers are eliminated from the drawing for clarity. In this example, the system and method described herein analyze the conductive lands 202 for adjacency, and produce a list 204 of high-potential test pairs of adjacent lands. Conductive lands 202 labeled "A" and "B" are found adjacent, for example, but conductive lands 202 labeled "A" and "C" are found not adjacent. An exclusion list 206 shows pairs of lands that are not to be high-potential tested, in some embodiments, or these pairs of lands could just be excluded from the list 204 of high-potential test pairs of adjacent lands, in some embodiments.

One algorithm, suitable for use in the system and method, is to analyze each conductive land 202 of a printed circuit board, and find whether each other conductive land 202 is or is not adjacent to that conductive land 202 under consideration. For example, considering the conductive land 202 labeled "G", the conductive lands 202 labeled "C", "F", "H", and "K" are found adjacent to the conductive land 202 "G", and pairs of conductive lands 202 "CG", "FG", "GH", "GK" are listed in the list 204 of high-potential test pairs of adjacent lands. Conductive lands 202 labeled "A", "B", "D", "E", "I", "J", and "L" are found not adjacent to the conductive land labeled "G", and pairs of conductive lands 202 "AG", "BG", "DG", "EG", "GI", "GJ", and "GL" are excluded from the list 204 of high-potential test pairs of adjacent lands. Optionally, the excluded pairs of conductive lands 202 are on the exclusion list 206. The remaining conductive lands 202 are readily considered in this same manner, as further examples and parts of the analysis. In some embodiments, once a pair of conductive lands 202 is listed in one order, it is not necessary to list the pair of conductive lands 202 in the reverse order, and one test at one high-potential (i.e., voltage and polarity) is sufficient, the pair need not be tested again with the voltage polarity reversed, e.g., where the PCB is transverse-isotropic for large conductor geometries. In further embodiments, the voltage polarity is reversed for a second high-potential test of each pair of adjacent conductive lands. Further algorithms are readily developed in keeping with the teachings herein.

An example of a test point 210 and via 208 connecting the test point 210 to one of the conductive lands 202 of the printed circuit board is also shown in FIG. 2. Usually, the test point 210 is on a surface of the printed circuit board, for physical contact during testing. Typically, a tester has a probe (see FIG. 3) with probe tips that make physical and electrical contact to test points 210 of the printed circuit board.

Figure 3:
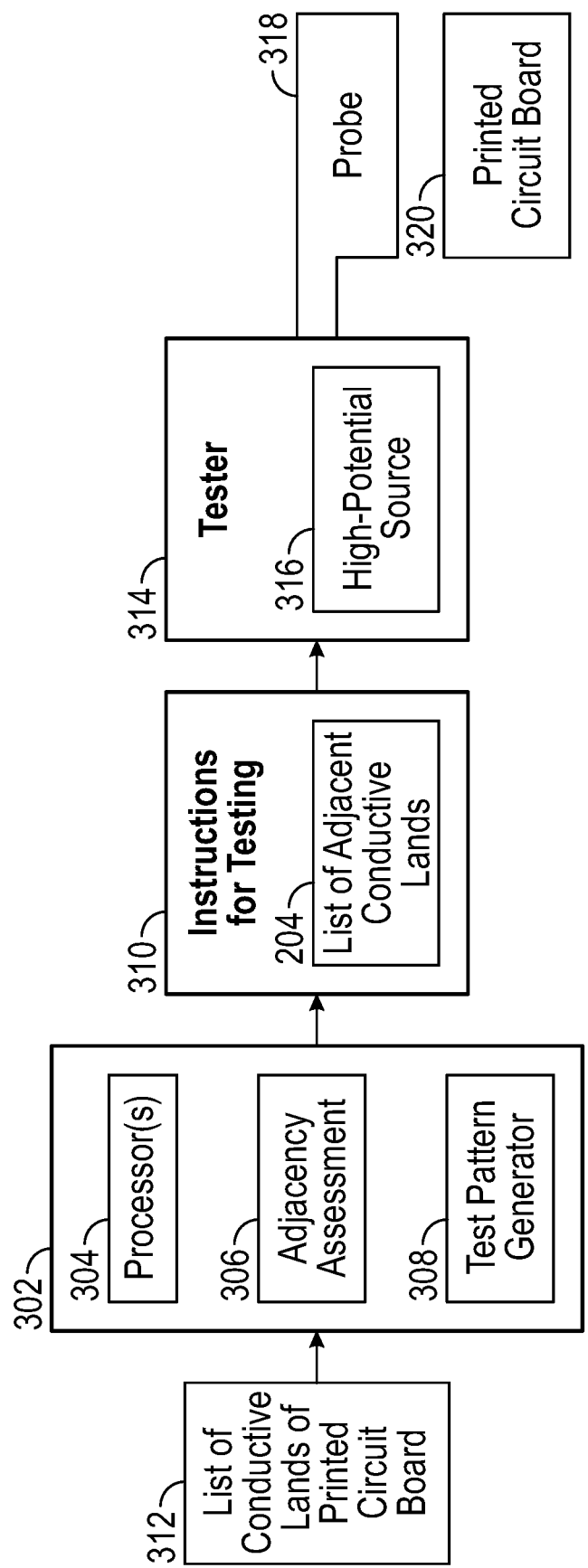
FIG. 3 is a block diagram of a system for test pattern generation and high-potential testing in accordance with present embodiments in accordance with some embodiments.

FIG. 3 is a block diagram of a system for test pattern generation and high-potential testing in accordance with present embodiments. One computing system 302 has one or more processors 304, and adjacency assessment module 306 and a test pattern generator 308, which could be implemented as software executing on the one or more processors 304, firmware, hardware, or combinations thereof. The tester 314 is another type of specialized computing system, dedicated to operating a probe 318 and testing the printed circuit board 320. In this embodiment, the tester 314 has a high-potential source 316 of various voltages or variable (e.g., programmable) voltage, for example from one or more power supplies, in order to perform high-potential testing.

The computing system 302 is used for test pattern generation, and receives a list 312 of conductive lands of a printed circuit board, from which the computing system 302 generates instructions 310 for high-potential testing including a list 204 of adjacent conductive lands. For example, the list 312 of conductive lands of a printed circuit board could be received as a file that has computer aided design (CAD) or computer-aided manufacturing (CAM) data for the design and manufacture of the printed circuit board. Such data includes geometry data describing layers and shapes of conductive lands, which the adjacency assessment module 306 analyzes to find pairs of adjacent conductive lands for high-potential testing. Using the results of the adjacency assessment, the test pattern generator 308 generates a test pattern directing high-potential testing of the pairs of adjacent conductive lands. The test pattern is output from the computing system 302 for test pattern generation as the instructions 310 for high-potential testing, including the list 204 of adjacent conductive lands, for example in the form of a file (e.g., a high-potential test pattern file). In some versions, the list 204 of adjacent conductive lands includes test point locations identifying test points 210 associated with conductive lands, for the high-potential testing.

Next, the instructions 310 for testing, including the list 204 of adjacent conductive lands, are input to the tester 314. The tester 314 performs high-potential testing of the adjacent conductive lands of the printed circuit board 320, accordingly, using the probe 318 to contact test points 210 (see FIG. 2) of the printed circuit board 320. In some embodiments, the instructions for testing 310 include a high-potential test matrix in the form of a list of conductive lands as nets, and lists which nets to test toward, and corresponding test point locations.

Figure 4:
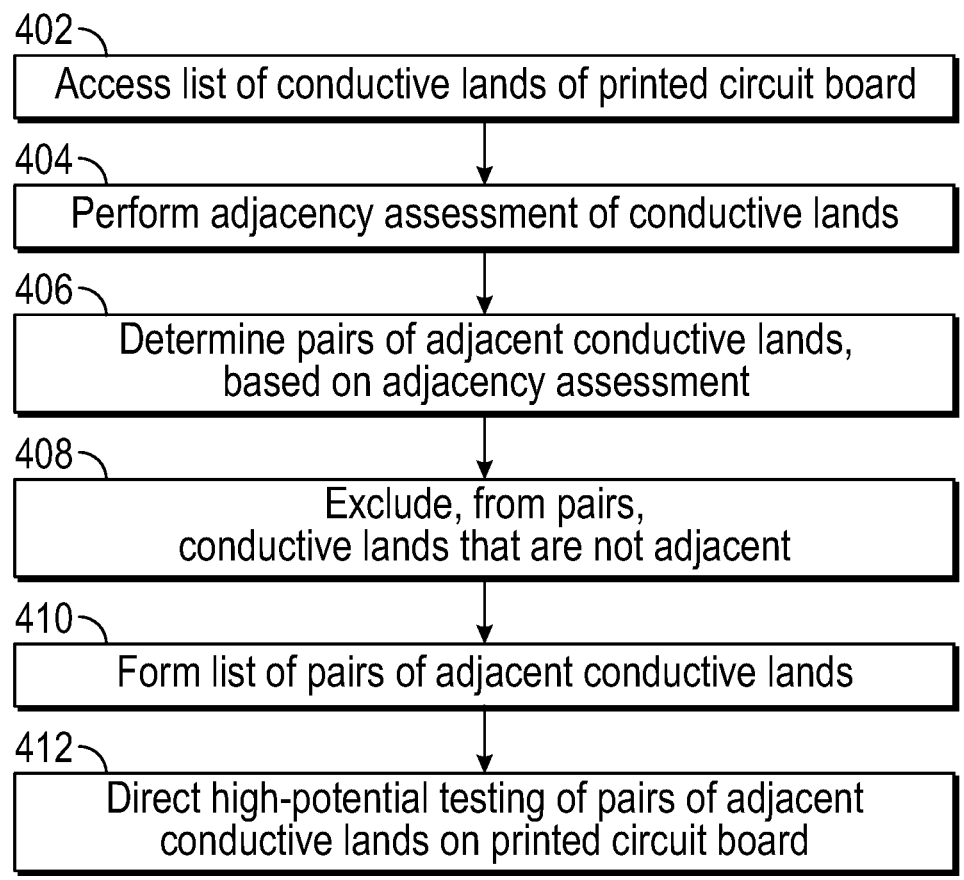
FIG. 4 is a flow diagram of a method for high-potential testing a printed circuit board in accordance with some embodiments.

FIG. 4 is a flow diagram of a method for high-potential testing a printed circuit board. The method can be practiced by embodiments described herein, and more specifically by one or more processors. In an action 402, a list of conductive lands of a printed circuit board is accessed. For example, this list could be the CAD or CAM data for a printed circuit board, with data showing the layers, locations and shapes, and connectivity of conductive lands of the printed circuit board. The list could be accessed by receiving a file, or reading a file that is already in memory, etc.

In an action 404, adjacency assessment is performed on the conductive lands. For example, each conductive land could be assessed to find adjacent conductive land(s) in, for example, vertical and horizontal directions. Diagonal directions could be considered in further embodiments. In an action 406, pairs of adjacent conductive lands are determined, based on the adjacency assessment. Each pair of adjacent conductive lands has two conductive lands that are adjacent, for example one conductive land and the conductive land(s) that is the closest to that conductive land. Equally spaced conductive lands could give rise to the situation where one conductive land has two adjacent conductive lands equally spaced from, and thus equally close to, the one conductive land.

In an action 408, conductive lands that are not adjacent are excluded from the pairs. That is, two conductive lands that are not adjacent are not permitted to be listed as a pair of adjacent conductive lands. In this embodiment, a conductive land that is farther away than the closest conductive land to a conductive land under consideration does not need to be tested with the conductive land under consideration. In an action 410, a list is formed, of pairs of adjacent conductive lands. This list is for high-potential testing, and could have various formats, for example listing pairs of adjacent conductive lands and corresponding test points, or just pairs of test points, etc.

In an action 412, high-potential testing of pairs of adjacent conductive lands on the printed circuit board is directed. Depending on context, the list of pairs of adjacent conductive lands, instructions for high-potential testing pairs of adjacent conductive lands, a machine producing such a list and/or instructions, a machine acting on such instructions, or some combination of these could be considered to be directing the high-potential testing of pairs of adjacent conductive lands.

Figure 5:
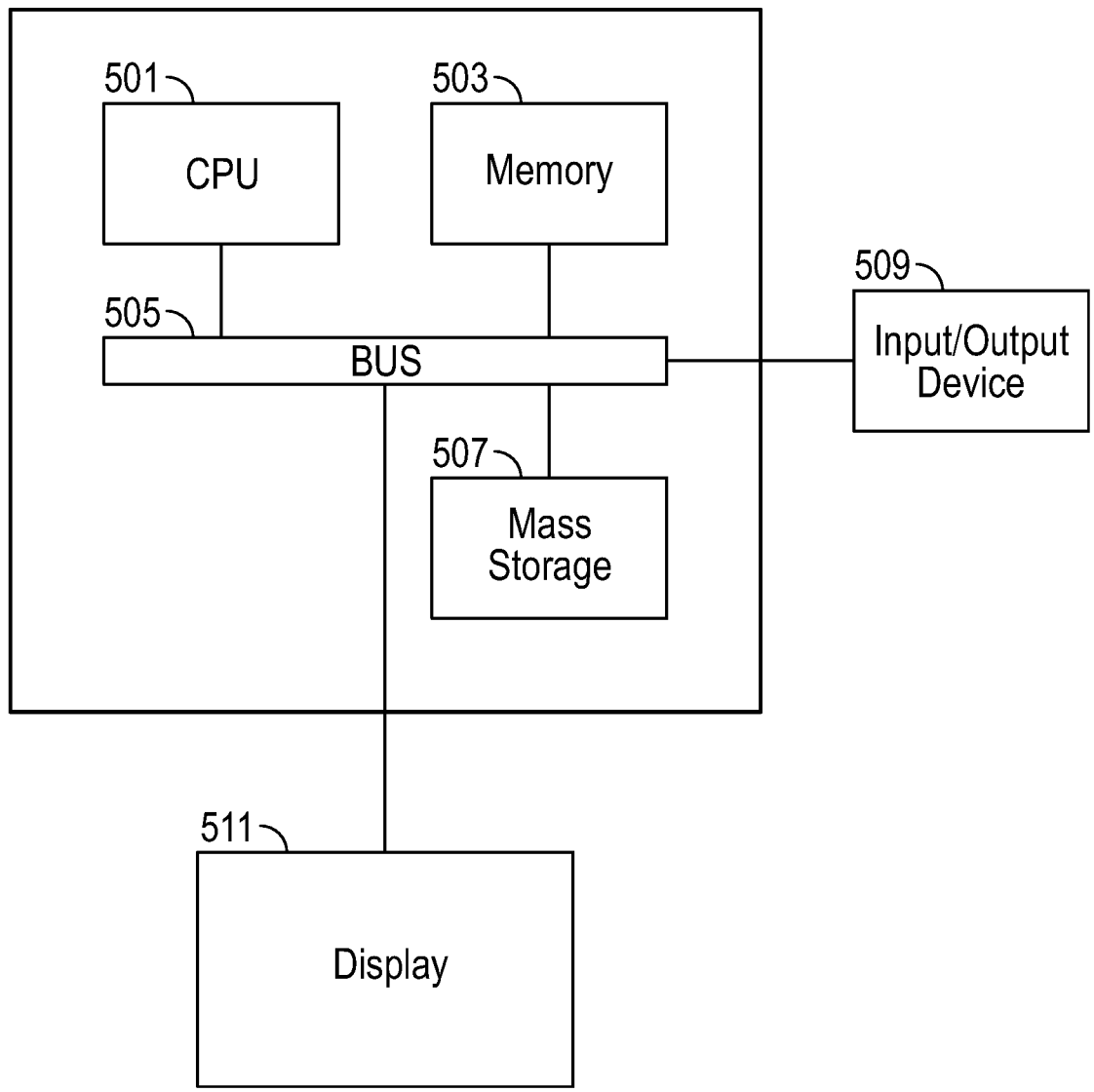
FIG. 5 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 5 is an illustration showing an exemplary computing device which may implement the embodiments described herein. The computing device of FIG. 5 may be used to perform embodiments of the functionality for adjacency assessment of conductive lands of a printed circuit board and high-potential testing in accordance with some embodiments. The computing device includes a central processing unit (CPU) 501, which is coupled through a bus 505 to a memory 503, and mass storage device 507. Mass storage device 507 represents a persistent data storage device such as a floppy disc drive or a fixed disc drive, which may be local or remote in some embodiments. The mass storage device 507 could implement a backup storage, in some embodiments. Memory 503 may include read only memory, random access memory, etc. Applications resident on the computing device may be stored on or accessed via a computer readable medium such as memory 503 or mass storage device 507 in some embodiments. Applications may also be in the form of modulated electronic signals modulated accessed via a network modem or other network interface of the computing device. It should be appreciated that CPU 501 may be embodied in a general-purpose processor, a special purpose processor, or a specially programmed logic device in some embodiments.

Display 511 is in communication with CPU 501, memory 503, and mass storage device 507, through bus 505. Display 511 is configured to display any visualization tools or reports associated with the system described herein. Input/output device 509 is coupled to bus 505 in order to communicate information in command selections to CPU 501. It should be appreciated that data to and from external devices may be communicated through the input/output device 509. CPU 501 can be defined to execute the functionality described herein to enable the functionality described with reference to FIGS. 1-4. The code embodying this functionality may be stored within memory 503 or mass storage device 507 for execution by a processor such as CPU 501 in some embodiments. The operating system on the computing device may be MS DOS™, MS-WINDOWS™, OS/2™, UNIX™, LINUX™, or other known operating systems. It should be appreciated that the embodiments described herein may also be integrated with a virtualized computing system that is implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method of testing a printed circuit board, comprising:
   accessing a list of conductive lands of a printed circuit board to be tested;
   for each conductive land of the list of conductive lands, subjecting the conductive land to an adjacency test to determine one or more conductive lands that are adjacent to the conductive land; and
   for the printed circuit board and each conductive land of the list of conductive lands, subjecting the conductive land and each of the one or more conductive lands that are adjacent to the conductive land to high-potential testing.

2. The method of testing of claim 1, wherein the adjacency test excludes, from the high-potential testing, conductive lands that are not adjacent to the conductive land.

3. The method of testing of claim 1, wherein each pair of adjacent conductive lands is subjected to the high-potential testing only once.

4. The method of testing of claim 1, further comprising:
   forming a list of test point locations for each conductive land of the list of conductive lands and each of the one or more conductive lands that are adjacent to the conductive land.

5. The method of testing of claim 1, wherein the subjecting the conductive land to the adjacency test comprises:
   identifying whether one or more conductive lands are above and adjacent to the conductive land;

identifying whether one or more conductive lands are beside and adjacent to the conductive land; and identifying whether one or more conductive lands are below and adjacent to the conductive land.

6. The method of testing of claim 1, wherein:

the list of conductive lands comprises a first conductive land above a second conductive land, and a third conductive land below the second conductive land;

the subjecting each of the first, second and third conductive lands to the adjacency test determines the first conductive land and the second conductive land are adjacent, the second conductive land and the third conductive land are adjacent, and the first conductive land and the third conductive land are not adjacent; and the subjecting to the high-potential testing comprises subjecting the first and second conductive lands to the high-potential testing and subjecting the second and third conductive lands to the high-potential testing, and not subjecting the first and third conductive lands to the high-potential testing.

7. The method of testing of claim 1, wherein the subjecting to the adjacency test comprises:

determining, on a same layer, one or more closest conductive lands to the conductive land; and determining, on each of one or more layers that are adjacent to a layer of the conductive land, one or more closest conductive lands.

8. A method for testing a printed circuit board, comprising:

accessing a list of conductive lands of a printed circuit board to be tested;

forming a list of pairs of adjacent conductive lands, based on adjacency assessment in the list of conductive lands; and performing high-potential testing on the printed circuit board, on each of the pairs of adjacent conductive lands.

9. The method for testing of claim 8, wherein the forming the list of pairs of adjacent conductive lands excludes pairs of conductive lands that are not adjacent.

10. The method for testing of claim 8, wherein the performing high-potential testing on each of the pairs of adjacent conductive lands reduces a total number of high-potential test combinations and total high-potential test time on the printed circuit board in comparison to high-potential testing each pair of conductive lands present in the list of conductive lands.

11. The method for testing of claim 8, further comprising:

forming a list of test points for the pairs of adjacent conductive lands.

12. The method for testing of claim 8, wherein the forming the list of pairs of adjacent conductive lands comprises:

assessing whether one or more conductive lands are above and adjacent to a conductive land; and assessing whether one or more conductive lands are beside and adjacent to the conductive land.

13. The method for testing of claim 8, wherein:

the list of conductive lands comprises a first conductive land, a second conductive land below the first conductive land, and a third conductive land below the second conductive land;

the forming the list of pairs of adjacent conductive lands based on adjacency assessment comprises adding the first conductive land and the second conductive land to the list of pairs of adjacent conductive lands as a first pair of adjacent conductive lands, adding the second conductive land and the third conductive lands to the list of pairs of adjacent conductive lands as a second pair of adjacent conductive lands, and excluding the first conductive land and the third conductive land from being a pair of adjacent conductive lands to be listed on the list of pairs of adjacent conductive lands; and the performing the high-potential testing comprises performing the high-potential testing on the first pair of adjacent conductive lands, the second pair of adjacent conductive lands, and not on the first conductive land and the third conductive land as a pair.

14. A tangible, non-transitory, computer-readable media having instructions thereupon which, when executed by a processor, cause the processor to perform a method comprising:

performing adjacency assessment of conductive lands on a list of conductive lands of a printed circuit board to be tested;

determining pairs of adjacent conductive lands, based on the adjacency assessment; and directing high-potential testing of each of the pairs of adjacent conductive lands on the printed circuit board.

15. The computer-readable media of claim 14, wherein the determining pairs of adjacent conductive lands excludes pairs of conductive lands that are not adjacent, from the high-potential testing of the pairs of adjacent conductive lands.

16. The computer-readable media of claim 14, wherein the directing the high-potential testing results in each pair of adjacent conductive lands being high-potential tested only once.

17. The computer-readable media of claim 14, wherein the method further comprises:

identifying a test point location for each conductive land in each of the pairs of adjacent conductive lands, wherein the high-potential testing is according to such test point locations.

18. The computer-readable media of claim 14, wherein the performing the adjacency assessment comprises:

identifying pairs of conductive lands each having a second conductive land above and adjacent to a first conductive land, beside and adjacent to the first conductive land, or below and adjacent to the first conductive land.

19. The computer-readable media of claim 14, wherein:

the list of conductive lands includes a third conductive land, a second conductive land above the third conductive land, and a first conductive land above the second conductive land;

the determining the pairs of adjacent conductive lands determines the second and third conductive lands are a second pair of adjacent conductive lands, the first and second conductive lands are a first pair of adjacent conductive lands, and the first and third conductive lands are not a pair of adjacent conductive lands; and the directing the high-potential testing includes directing the high-potential testing of the first pair and the second pair of adjacent conductive lands, and not high-potential testing the first and third conductive lands as a pair.

20. The computer-readable media of claim 14, wherein the determining the pairs of adjacent conductive lands determines one or more closest conductive lands for each of the conductive lands on the list of conductive lands, and excludes, from the pairs of adjacent conductive lands, pairs comprising one of the conductive lands and conductive lands that are farther away than the one or more closest conductive lands for the one of the conductive lands.

\* \* \* \* \*